United States Patent
Ding

(10) Patent No.: US 7,388,272 B2
(45) Date of Patent: Jun. 17, 2008

(54) CHIP PACKAGE AND PRODUCING METHOD THEREOF

(75) Inventor: Yi-Chuan Ding, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 187 days.

(21) Appl. No.: 11/298,522

(22) Filed: Dec. 12, 2005

(65) Prior Publication Data
US 2006/0163704 A1 Jul. 27, 2006

(30) Foreign Application Priority Data
Jan. 21, 2005 (TW) .............................. 94101926 A

(51) Int. Cl.
*H01L 23/544* (2006.01)
(52) U.S. Cl. ...................... 257/483; 257/484; 257/485; 257/620
(58) Field of Classification Search ........ 257/483–485, 257/605, 620, 409
See application file for complete search history.

(56) References Cited

U.S. PATENT DOCUMENTS

| 5,552,639 | A | * | 9/1996 | Hara et al. | ................... | 257/775 |
| 6,167,194 | A | * | 12/2000 | Moto et al. | .................. | 392/418 |
| 6,455,910 | B1 | * | 9/2002 | Wang | .......................... | 257/484 |

* cited by examiner

*Primary Examiner*—Jasmine Clark
(74) *Attorney, Agent, or Firm*—Bacon & Thomas PLLC

(57) ABSTRACT

A chip package including a carrier, a chip, a stiffener and a molding compound is provided. A producing method of the chip package includes the steps of disposing a bottom surface of the chip on the carrier; covering an edge of a top surface of the chip with the stiffener for protecting the edge; then wire bonding the top surface of the chip with the carrier; and forming the molding compound for encapsulating the chip, the stiffener and parts of the carrier.

11 Claims, 3 Drawing Sheets

CHIP PACKAGE AND PRODUCING METHOD THEREOF

This application claims the benefit of Taiwan application Serial No. 94101926, filed Jan. 21, 2005, the subject matter of which is incorporated herein by reference.

BACKGROUND OF THE INVENTION

1. Field of the Invention

The invention relates in general toga chip package and a producing method thereof, and more particularly to a chip package with a stiffener and the producing method thereof.

2. Description of the Related Art

In a conventional chip package, the chip, particular the low dielectric constant (low-K) chip, is fragile due to the mismatch of coefficients of thermal expansion (CTE) of the materials inside the chip package, so the edges of the top surface of the chip crack easily. Due to the excellent telecommunication performance and fast transmission speed of signals, the low dielectric constant chip has been widely used nowadays. Therefore, the fragmentation on the edges of the chip has become an imminent issue to be resolved.

SUMMARY OF THE INVENTION

It is therefore an object of the invention to provide a chip package and a producing method thereof. A stiffener covers an edge of the top surface of the chip for protecting the edge.

The invention achieves the above-identified object by providing a chip package. The chip package includes a carrier, a chip, a stiffener and a molding compound. The chip has a top surface and a bottom surface opposite to the top surface. The bottom surface is disposed on the carrier, and the top surface is wire bonded with the carrier. The stiffener covers an edge of the top surface for protecting the edge. The molding compound encapsulates the chip, the stiffener and parts of the carrier.

The invention achieves the above-identified object by providing another producing method of the chip package. The method includes the following steps. Firstly, a carrier is provided. Next, a chip is disposed on the carrier. Afterwards, an edge of the top surface of the chip is covered by a stiffener for protecting the edge. Then, the top surface of the chip is wire bonded with the carrier. Finally, a molding compound is formed for encapsulating the chip, the stiffener and parts of the carrier.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1A:
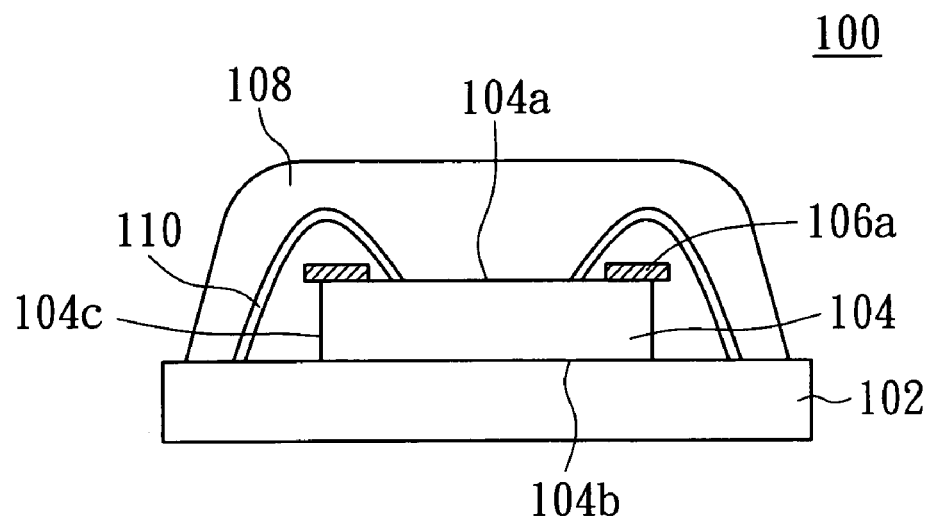
FIG. 1A is a cross-sectional view of a chip package with a flat ring-shaped stiffener according to the invention.
Figure 1B:
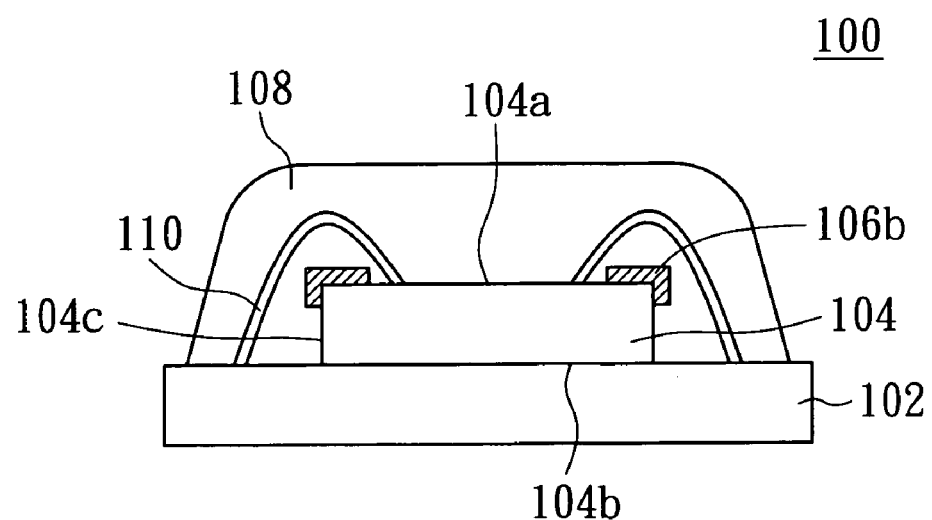
FIG. 1B is a cross-sectional view of a chip package with a deflected ring-shaped stiffener according to the invention.

Referring to both FIG. 1A and FIG. 1B. FIG. 1A is a cross-sectional view of a chip package with a flat ring-shaped stiffener according to the invention, and FIG. 1B is a cross-sectional view of a chip package with a deflected ring-shaped stiffener according to the invention. The chip package 100 includes a carrier 102, a chip 104, a stiffener and a molding compound 108. The carrier 102 can be a substrate for instance. The chip 104 can be a low dielectric constant (low-K) chip having a top surface 104a, a bottom surface 104b and an outer sidewall 104c. The top surface 104a is opposite to the bottom surface 104b. The outerside wall 104c connects the top surface 104a and the bottom surface 104b. The bottom surface 104b is disposed on the carrier 102, and the top surface 104a is electrically connected to the carrier 102 via the circuit 110. The stiffener covers an edge of the top surface 104a for protecting the edge. The stiffener encapsulates the edge in a manner as shown in FIG. 1 A where the stiffener is a flat ring-shaped stiffener 106a and is horizontally projected from the edge, or as shown in FIG. 1B where the stiffener is a deflected ring-shaped stiffener 106b projected outwardly from an edge of the top surface 104a and is deflected downwardly to the outer sidewall 104c, so that the deflected ring-shaped stiffener 106b encapsulates parts of the outer sidewall 104c. The outer sidewall 104c of the chip 104 forms a deflection connecting part with the top surface 104a. The deflected ring-shaped stiffener 106b can be connected to the deflection connecting part. Besides, the stiffener includes metal or ceramics.

Figure 2:
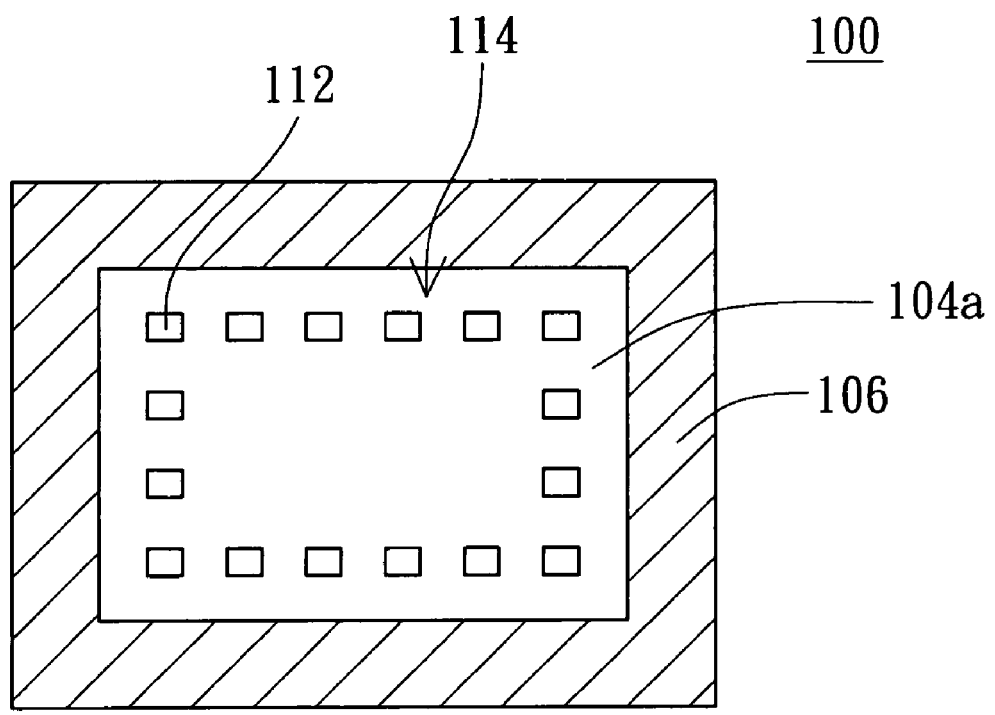
FIG. 2 is a top view of a chip covered by a stiffener.

Referring to FIG. 2, a top view of a chip covered by a stiffener illustrates how the stiffener covers the top surface 104a. The top surface 104a has several pads 112, and the stiffener 106 has an opening 114. The opening 114 of the stiffener 106 exposes the pad 112, so that the stiffener 106 protects the peripheral of the top surface 104a.

Figure 3:
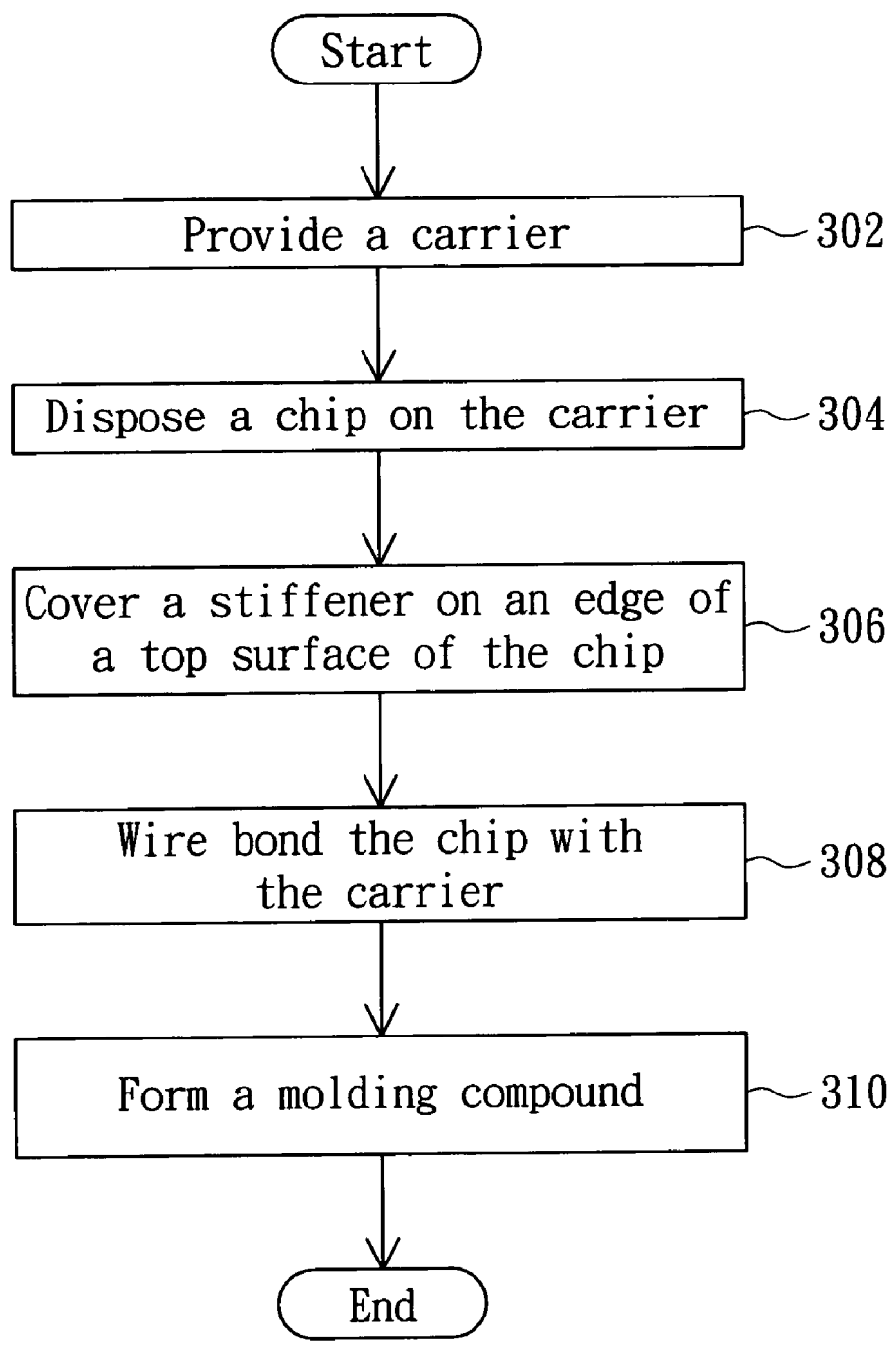
FIG. 3 is a producing method of the chip package according to the preferred embodiment of the invention.

Referring to FIG. 1A, FIG. 1B and FIG. 3 at the same time. FIG. 3 is a producing method of the chip package according to the preferred embodiment of the invention. The producing method of the chip package 100 includes the following steps. Firstly, the method begins at step 302: a carrier 102 is provided. Next, proceed to step 304: a chip 104 is disposed on the carrier 102. Afterwards, proceed to step 306: an edge of the top surface 104a of the chip 104 is covered by a stiffener for protecting the edge. The stiffener can be a flat ring-shaped stiffener 106a horizontally projected from an edge of the top surface 104a as shown in FIG. 1A, or a deflected ring-shaped stiffener 106b as shown in FIG. 1B. The deflected ring-shaped stiffener 106b covers the edges of the top surface 104a and is deflected downwardly to the outer sidewall 104c like an inverted U, so that the deflected ring-shaped stiffener 106b encapsulates an edge of the top surface 104a and parts of the outer sidewall 104c. Then, proceed to step 308: the top surface 104a of the chip 104 is wire bonded with the carrier 102. The circuit 110 is for electrically connecting the top surface 104a with the carrier 102. Finally, proceed to step 310: a molding compound 108 is formed for encapsulating the chip 104, the stiffener and parts of the carrier 102. By doing so, the producing method of the chip package 100 is completed.

The chip package disclosed in the aforementioned embodiment of the invention encapsulates a stiffener on an edge of the top surface of the chip for protecting the edge of the top surface of the chip, effectively avoiding the fragmentation on the edge of the top surface of the chip due to the frangibility of the chip in prior arts.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A chip package, comprising:
   a carrier;
   a chip having a top surface, a bottom surface and a side wall, wherein the bottom surface is disposed on the carrier, and the top surface is wire bonded with the carrier;
   a stiffener covering an edge between the top surface and the side wall and being projected outwardly from the edge and the side wall for protecting the edge; and
   a molding compound for encapsulating the chip, the stiffener and parts of the carrier.

2. The package according to claim 1, wherein the stiffener is further covers part of the top surface near the edge.

3. The package according to claim 2, wherein the stiffener is a flat ring-shaped stiffener.

4. The package according to claim 2, wherein the stiffener is further deflected downwardly to cover part of the side wall near the edge.

5. The package according to claim 4, wherein the stiffener is a deflected ring-shaped stiffener.

6. The package according to claim 4, wherein the chip further comprises an outer sidewall forming a deflection connecting part with the top surface, and the stiffener is connected to the deflection connecting part.

7. The package according to claim 1, wherein the stiffener includes metal.

8. The package according to claim 1, wherein the stiffener includes ceramics.

9. The package according to claim 1, wherein the top surface has a plurality of pads, the stiffener has an opening, and the opening exposes the pads.

10. The package according to claim 1, wherein the chip is a low dielectric constant (low-K) chip.

11. The package according to claim 1, wherein the carrier is a substrate.

* * * * *